(12) United States Patent
Krishnan

(10) Patent No.: US 12,400,709 B2
(45) Date of Patent: Aug. 26, 2025

(54) SYSTEMS AND METHODS FOR DATA STORAGE

(71) Applicant: QUANTRAM CORPORATION, Los Altos, CA (US)

(72) Inventor: Sivaram Krishnan, Los Altos, CA (US)

( * ) Notice: Subject to any disclaimer, the term of this patent is extended or adjusted under 35 U.S.C. 154(b) by 370 days.

(21) Appl. No.: 18/069,820

(22) Filed: Dec. 21, 2022

(65) Prior Publication Data

US 2023/0386571 A1 Nov. 30, 2023

Related U.S. Application Data

(63) Continuation of application No. 17/746,791, filed on May 17, 2022, now abandoned, which is a
(Continued)

(51) Int. Cl.
| | | |
|---|---|---|
| *G11C 13/00* | (2006.01) | |
| *H10B 63/00* | (2023.01) | |
| *H10N 70/00* | (2023.01) | |

(52) U.S. Cl.
CPC ...... *G11C 13/0007* (2013.01); *G11C 13/0038* (2013.01); *G11C 13/004* (2013.01);
(Continued)

(58) Field of Classification Search
CPC ............ G11C 13/0007; G11C 2213/77; G11C 2213/56; G11C 13/0011; G11C 13/0069; G11C 13/0004; G11C 13/003; G11C 13/004; G11C 13/0002; G11C 13/0097; G11C 2213/15; G11C 2213/76;
(Continued)

(56) References Cited

U.S. PATENT DOCUMENTS 8,320,160 B2 * 11/2012 Nazarian ............ G11C 16/0483
365/163
2008/0152932 A1 6/2008 Bednorz et al.
(Continued)

OTHER PUBLICATIONS

PCT/US2020/061949 International Preliminary Report on Patentability dated May 17, 2022.
(Continued)

*Primary Examiner* — Thong Q Le
(74) *Attorney, Agent, or Firm* — André Grouwstra

(57) ABSTRACT

The present disclosure provides systems, devices, and methods for data storage. Systems and devices for data storage may include memory cells with a first electrode, a second electrode, and a switching medium electrically coupled to the first and second electrode. The switching medium may be configured to provide or may provide a conductive path. The switching medium may be configured to provide or may provide a plurality of resistance states. A resistance state of the switching medium may be changed by application of different voltage biases for a period of time, a constant voltage for different periods of time, or a voltage of a different polarity as comparted to a previously applied voltage. Data may be written to a memory cell by changing the resistance state of the switching medium. Data may be accessed by sensing or detecting the resistance of the switching medium.

19 Claims, 11 Drawing Sheets

Related U.S. Application Data continuation of application No. PCT/US2020/061949, filed on Nov. 24, 2020.

(60) Provisional application No. 62/941,558, filed on Nov. 27, 2019.

(52) U.S. Cl.
CPC ......... *G11C 13/0069* (2013.01); *H10B 63/80* (2023.02); *H10N 70/841* (2023.02); *H10N 70/8833* (2023.02)

(58) Field of Classification Search
CPC ............ G11C 13/0026; G11C 13/0028; G11C 2213/51; G11C 2213/52; G11C 2213/73; G11C 13/0038; G11C 16/0483; G11C 2213/31; G11C 2213/33; G11C 2213/53; G11C 2213/71; G11C 2213/75; G11C 11/5685; G11C 13/04; G11C 2013/0073; G11C 2213/50; G11C 2213/55; G11C 2213/72; G11C 5/06; H10N 70/245; H10N 70/826; H10N 70/883; H10N 70/884; H10N 70/8833; H10N 70/011; H10N 70/021; H10N 70/8416; H10N 70/801; H10N 70/841; H10N 70/8822; H10N 70/8825; H10N 70/823; H10N 70/026; H10N 70/24; H10N 70/253; H10N 70/821; H10N 70/8836; H10B 63/80; H10B 63/20; H10B 63/30; H10B 63/22; H10B 63/845
USPC ............... 365/148, 163, 158, 185.17, 185.18
See application file for complete search history.

(56) References Cited

U.S. PATENT DOCUMENTS

| | | |
|---|---|---|
| 2010/0283028 A1 | 11/2010 | Brubaker et al. |
| 2013/0214235 A1 | 8/2013 | Hong et al. |
| 2016/0248006 A1 | 8/2016 | Shi et al. |

OTHER PUBLICATIONS

PCT/US2020/061949 International Search Report and Written Opinion dated Feb. 9, 2021.

Shi, et al. Colossal resistance switching and band gap modulation in a perovskite nickelate by electron doping. Nat Commun. Sep. 3, 2014;5:4860. doi: 10.1038/ncomms5860.

\* cited by examiner

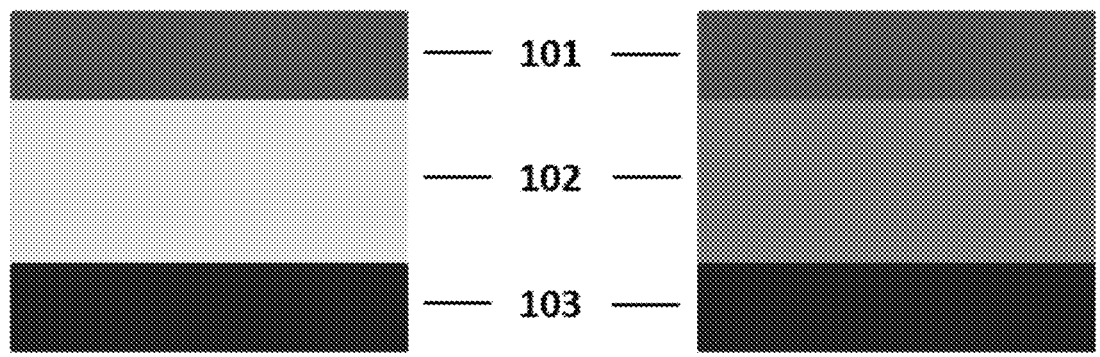
FIG. 1A  FIG. 1B
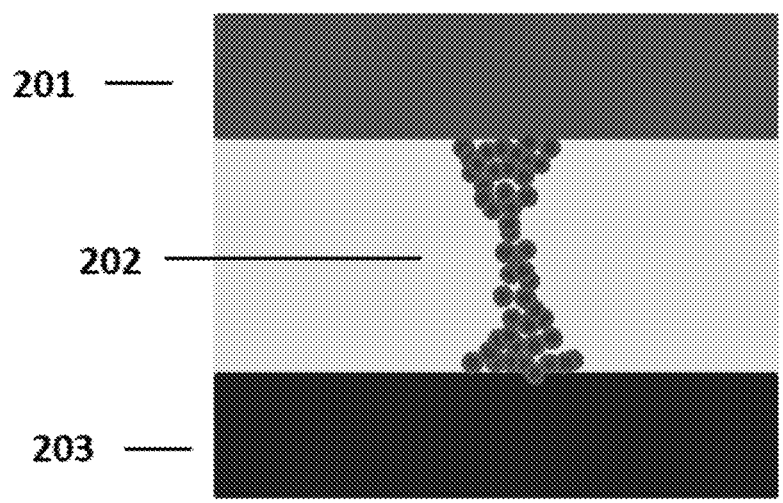
FIG. 2

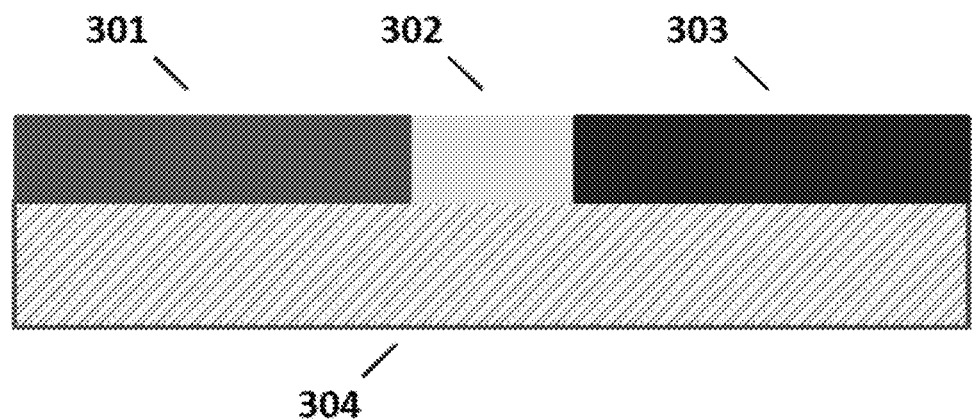
*FIG. 3*A
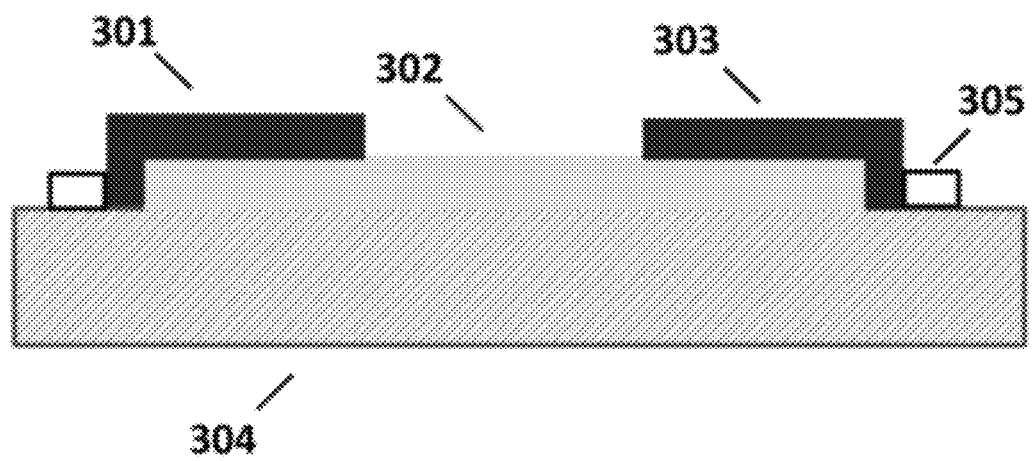
*FIG. 3B*

SYSTEMS AND METHODS FOR DATA STORAGE

CROSS-REFERENCE

This application is a continuation of U.S. patent application Ser. No. 17/746,791, filed May 17, 2022, which is a continuation of International Patent Application No. PCT/US2020/061949, filed Nov. 24, 2020, which claims the benefit of U.S. Provisional Patent Application No. 62/941,558, filed Nov. 27, 2019, each of which is entirely incorporated herein by reference in its entirety.

BACKGROUND

Electronic systems and devices may use memory or data storage devices to store data. Memory or storage devices may include high-speed memories that can be accessed quickly and frequently by central processing units (CPUs). Example memory or storage devices may include static random-access memory (SRAM), dynamic random-access memory (DRAM), resistive random-access memory (RRAM), magnetic random-access memory (MRAM), phase-change random-access memory (PCRAM), and embedded memory technologies. Memory or data storage devices may be volatile (e.g., lose data over time or in the event of a power loss). Others, such as Flash memory, may be non-volatile (e.g., may retain data over a long time and/or are not powered continuously to maintain data).

SUMMARY

Provided herein are systems, devices, and methods for high-performance persistent memory. High-performance persistent memory may be non-volatile, durable, and scalable and may provide for high-speed switching with low power consumption.

According to some aspects of the disclosure, a memory cell is provided. The memory cell may comprise a first electrode, a second electrode and a switching medium electrically coupled to the first electrode and the second electrode. The switching medium may be configured such that at least a portion of the switching medium provides a homogenous conducting path between the first electrode and the second electrode, and wherein a resistance of the homogeneous conducting path is configured to provide a value of the memory cell. In some embodiments, the switching medium may be homogenous.

In some embodiments, the switching medium comprises a chemical formula of $ABO_n$. In some embodiments, the chemical formula is $ABO_3$. In some embodiments, A is selected from the group consisting of europium, neodymium, samarium, lanthanum, gadolinium, calcium, magnesium, iron, sodium, potassium, strontium, lithium, lead or barium, and combinations thereof. In some embodiments, A is selected from the group consisting of neodymium, samarium, and europium. In some embodiments, B is selected from the group consisting of tungsten, iron, nickel, manganese, silicon, tantalum, titanium, niobium, chromium, cobalt, cerium, and combinations thereof. In some embodiments, B is selected from the group consisting of nickel, niobium, tantalum, and titanium. In some embodiments, A is neodymium, samarium, or europium and B is nickel.

In some embodiments, the first and the second electrode comprise the same material. In some cases, the first and the second electrode comprise an alloy of metals or a compound. In some embodiments, the first and second electrode comprise a single material. In other instances, the first and second electrode comprise different materials.

The structure of the memory cell may be selected from the group consisting of a mesa structure, crossbar (sandwich) structure, and floating gate structure. In some instances where the structure of the memory cell is crossbar structure, the first electrode may be electrically coupled to an ohmic contact and the second electrode may be electrically coupled to a Schottky contact.

The switching medium may be doped with hydrogen ions or lithium ions.

In another aspect of the disclosure a memory cell is provided. The memory cell may comprise a first electrode, a second electrode and a switching medium electrically coupled to the first electrode and the second electrode, wherein the switching medium is configured to provide a plurality of resistance states, wherein a resistance state of the plurality of resistance states changes upon application of (i) different voltage biases for a period of time, (ii) a constant voltage for different periods of time, or (iii) a voltage of a different polarity as compared to a previously applied voltage, and wherein the resistance state of the switching medium is configured to provide a value of the memory cell.

The switching medium may be non-filamentary. The switching medium may further comprise a chemical formula of $ABO_n$. In some embodiments, the chemical formula is $ABO_3$. In some embodiments, A is selected from the group consisting of europium, neodymium, samarium, lanthanum, gadolinium, calcium, magnesium, iron, sodium, potassium, strontium, lithium, lead or barium, and combinations thereof. In some embodiments, A is selected from the group consisting of neodymium, samarium, and europium. In some embodiments, B may be selected from the group consisting of tungsten, iron, nickel, manganese, silicon, tantalum, titanium, niobium, chromium, cobalt, cerium, and combinations thereof. In some embodiments, B is selected from the group consisting of nickel, niobium, tantalum, and titanium. In some embodiments, A is neodymium, samarium, or europium and B is nickel.

In some embodiments, the first and the second electrode comprise the same material. In some cases, the first and the second electrode comprise an alloy of metals or a compound. In some embodiments, the first and second electrode comprise a single material. In other instances, the first and second electrode comprise different materials.

The structure of the memory cell may be selected from the group consisting of a mesa structure, crossbar structure, and floating gate structure. In some instances where the structure of memory cell is crossbar structure, the first electrode may be electrically coupled to an ohmic contact and the second electrode may be electrically coupled to a Schottky contact.

The switching medium may be doped with hydrogen ions or lithium ions.

According to one aspect of the disclosure, a method of accessing data from a memory cell is provided. The method may comprise (a) providing the memory cell comprising a first electrode, a second electrode, and a switching medium electrically coupled to the first electrode and the second electrode, wherein at least a portion of the switching medium provides a homogenous conducting path between the first electrode and the second electrode; and (b) determining a resistance of the homogeneous conducting path to thereby determine a value of the memory cell. In some embodiments, the switching medium is a homogenous switching medium.

Determining the resistance of the homogeneous conducting path may comprise voltage sensing. Determining the resistance of the homogeneous conducting path may further comprise applying a plurality of pulses of different voltage magnitudes to the memory cell to determine the resistance. In some embodiments, determining the resistance of the homogeneous conducing path may comprise current sensing. Determining the resistance using current sensing may further comprise applying a single voltage pulse to the memory cell to determine the resistance.

The structure of the memory cell may be selected from the group consisting of a mesa structure, crossbar structure, and floating gate structure. In some instances where the structure of memory cell is crossbar structure, the first electrode may be electrically coupled to an ohmic contact and the second electrode may be electrically coupled to a Schottky contact.

The switching medium may further comprise a chemical formula of $ABO_n$. In some embodiments, the chemical formula is $ABO_3$. In some embodiments, A is selected from the group consisting of europium, neodymium, samarium, lanthanum, gadolinium, calcium, magnesium, iron, sodium, potassium, strontium, lithium, lead or barium, and combinations thereof. In some embodiments, A is selected from the group consisting of neodymium, samarium, and europium. In some embodiments, B is selected from the group consisting of tungsten, iron, nickel, manganese, silicon, tantalum, titanium, niobium, chromium, cobalt, cerium, and combinations thereof. In some embodiments, B is selected from the group consisting of nickel, niobium, tantalum, and titanium. In some embodiments, A is neodymium, samarium, or europium and B is nickel.

In another aspect of the disclosure, a method for writing data to a memory cell is provided. The method may comprise (a) providing the memory cell comprising a first electrode, a second electrode, and a switching medium electrically coupled to the first electrode and the second electrode, wherein the switching medium is configured to provide a plurality of resistance states; and (b) applying to the switching medium (i) different voltage biases for a period of time, (ii) a constant voltage for different periods of time, or (iii) a voltage of a different polarity as compared to a previously applied voltage to change a resistance state of the plurality of resistance states to thereby write a value to the memory cell.

In some embodiments, the switching time of the switching medium is altered by applying a plurality of voltage pulses, and wherein a voltage pulse of the plurality of voltage pulses may have a different magnitude than another voltage pulse of the plurality of voltage pulses.

In some embodiments, the resistance state is changed by applying different voltage biases for a period of time. In other instances, the resistance state is changed by applying a constant voltage for different periods of time. In some cases, the resistance state is changed by applying a voltage of a different polarity as compared to a previously applied voltage.

The structure of the memory cell may be selected from the group consisting of a mesa structure, crossbar structure, and floating gate structure. In some instances where the structure of memory cell is crossbar structure, the first electrode is electrically coupled to an ohmic contact and the second electrode is electrically coupled to a Schottky contact.

The switching medium may further comprise a chemical formula of $ABO_n$. In some embodiments, the chemical formula is $ABO_3$. In some embodiments, A is selected from the group consisting of europium, neodymium, samarium, lanthanum, gadolinium, calcium, magnesium, iron, sodium, potassium, strontium, lithium, lead or barium, and combinations thereof. In some embodiments, A is selected from the group consisting of neodymium, samarium, and europium. In some embodiments, B is selected from the group consisting of tungsten, iron, nickel, manganese, silicon, tantalum, titanium, niobium, chromium, cobalt, cerium, and combinations thereof. In some embodiments, B is selected from the group consisting of nickel, niobium, tantalum, and titanium. In some embodiments, A is neodymium, samarium, or europium and B is nickel.

In another aspect of the disclosure, a system for data storage is provided. The system may comprise a memory device comprising a plurality of memory cells, wherein a memory cell of the plurality of memories cells comprise a first electrode, a second electrode, and a switching medium electrically coupled to the first electrode and the second electrode, wherein the switching medium is configured such that at least a portion of the switching medium provides a homogeneous conducting path between the first electrode and the second electrode; and one or more computer processors individually or collectively coupled to the memory device, wherein the one or more processors are configured to determining a resistance of the homogeneous conducting path to thereby determine a value of the memory cell.

In some embodiments, the switching medium comprises a chemical formula of $ABO_n$. In some embodiments, the chemical formula is $ABO_3$. In some embodiments, A is selected from the group consisting of europium, neodymium, samarium, lanthanum, gadolinium, calcium, magnesium, iron, sodium, potassium, strontium, lithium, lead or barium, and combinations thereof. In some embodiments, A is selected from the group consisting of neodymium, samarium, and europium. In some embodiments, B is selected from the group consisting of tungsten, iron, nickel, manganese, silicon, tantalum, titanium, niobium, chromium, cobalt, cerium, and combinations thereof. In some embodiments, B is selected from the group consisting of nickel, niobium, tantalum, and titanium. In some embodiments, A is neodymium, samarium, or europium and B is nickel.

In some embodiments, the first and the second electrode comprise the same material. In some cases, the first and the second electrode comprise an alloy of metals or a compound. In some embodiments, the first and second electrode comprise a single material. In other instances, the first and second electrode comprise different materials.

The structure of the memory cell may be selected from the group consisting of a mesa structure, crossbar structure, and floating gate structure. In some instances where the structure of memory cell is crossbar structure, the first electrode is electrically coupled to an ohmic contact and the second electrode is electrically coupled to a Schottky contact.

In some embodiments, the system further comprises a selector configured to select a given memory cell of the plurality of memory cells.

The switching medium may be doped with hydrogen ions or lithium ions.

In another aspect of the disclosure, a system for data storage is provided. The system may comprise a memory device comprising a plurality of memory cells, wherein a memory cell of the plurality of memories cells comprise a first electrode, a second electrode, and a switching medium electrically coupled to the first electrode and the second electrode, wherein the switching medium is configured to provide a plurality of resistance states; and one or more computer processors individually or collectively coupled to the memory device, wherein the one or more processors are configured to apply to the switching medium (i) different voltage biases for a period of time, (ii) a constant voltage for different periods of time, or (iii) a voltage of a different polarity as compared to a previously applied voltage to change a resistance state of the plurality of resistance states to thereby write a value to the memory cell.

The switching medium may be non-filamentary. The switching medium may further comprise a chemical formula of $ABO_n$. In some embodiments, the chemical formula is $ABO_3$. In some embodiments, A is selected from the group consisting of europium, neodymium, samarium, lanthanum, gadolinium, calcium, magnesium, iron, sodium, potassium, strontium, lithium, lead or barium, and combinations thereof. In some embodiments, A is selected from the group consisting of neodymium, samarium, and europium. In some embodiments, B is selected from the group consisting of tungsten, iron, nickel, manganese, silicon, tantalum, titanium, niobium, chromium, cobalt, cerium, and combinations thereof. In some embodiments, B is selected from the group consisting of nickel, niobium, tantalum, and titanium. In some embodiments, A is neodymium, samarium, or europium and B is nickel.

In some embodiments, the first and the second electrode may be may comprise the same material. In some cases, the first and the second electrode may be may comprise an alloy of metals or a compound. In some embodiments, the first and second electrode may comprise a single material. In other instances, the first and second electrode may comprise different materials.

The structure of the memory cell may be selected from the group consisting of a mesa structure, crossbar structure, and floating gate structure. In some instances where the structure of memory cell is crossbar structure, the first electrode is electrically coupled to an ohmic contact and the second electrode is electrically coupled to a Schottky contact.

In some embodiments, the system may further comprise a selector configured to select a given memory cell of the plurality of memory cells.

The switching medium may be doped with hydrogen ions or lithium ions.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference. To the extent publications and patents or patent applications incorporated by reference contradict the disclosure contained in the specification, the specification is intended to supersede and/or take precedence over any such contradictory material.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "figure" and "FIG." herein), of which:

FIG. 1A and FIG. 1B schematically illustrate an example of a memory cell with a homogeneous conductivity path; FIG. 1A schematically illustrates an example of a memory cell with a switching medium of a first resistance; FIG. 1B schematically illustrates an example of a memory cell with a switching medium of a second resistance;

FIG. 2 schematically illustrates an example of a memory cell with a filamentary conductivity path;

FIG. 3A and FIG. 3B schematically illustrate examples of a mesa type memory cell;

FIG. 7A and FIG. 7B and FIG. 7C schematically illustrate examples of electrode configurations, wherein FIG. 7A shows a conventional electrode configuration that may also be used in an implementation in the disclosed technology;

DETAILED DESCRIPTION

Figure 4A:
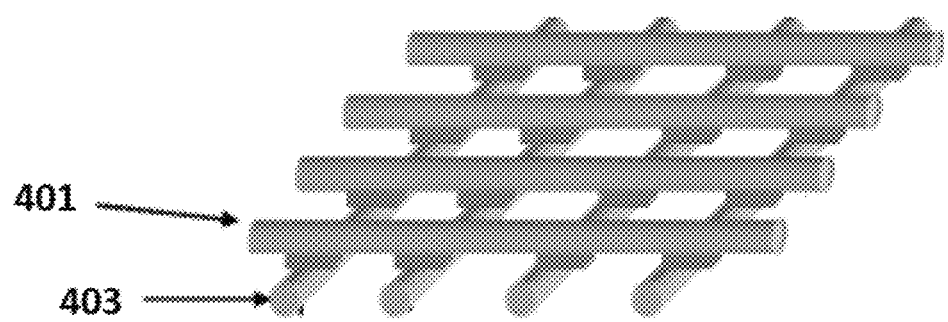
FIG. 4A and FIG. 4B schematically illustrate examples of a crossbar type memory cell.

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

Whenever the term "at least," "greater than," or "greater than or equal to" precedes the first numerical value in a series of two or more numerical values, the term "at least," "greater than" or "greater than or equal to" applies to each of the numerical values in that series of numerical values. For example, greater than or equal to 1, 2, or 3 is equivalent to greater than or equal to 1, greater than or equal to 2, or greater than or equal to 3.

Whenever the term "no more than," "less than," or "less than or equal to" precedes the first numerical value in a series of two or more numerical values, the term "no more than," "less than," or "less than or equal to" applies to each of the numerical values in that series of numerical values. For example, less than or equal to 3, 2, or 1 is equivalent to less than or equal to 3, less than or equal to 2, or less than or equal to 1.

The term "switching medium," as used herein, generally refers to a material disposed between or electrically coupled to at least two electrodes. The switching medium may comprise a material configured to or capable of changing a physical property of the material upon application of an external stimuli. For example, the switching medium may be capable of changing electrical resistance of the material upon application of electrical stimulation, for example, application of a select voltage or current across the switching medium.

The term "homogeneous conducting path," as used herein, generally refers to a conducting path in the switching medium where at least a portion of the switching medium acts as a conducting path (e.g., a portion of the switching medium acting as a conducting path exhibits the same conductivity). A homogenous conducting path is not a filamentary conducting path. For example, a portion of the switching medium or substantially all of the switching medium may have a first conductivity during or after application of a first electrical stimulation and a second conductivity during or after application of a second electrical stimulation to the switching medium. A homogeneous conducting path may occupy greater than or equal to about 80%, 85%, 90%, 95%, 98%, 99%, or 100% of the volume of the switching medium. In an example, the entire switching medium may act as a conducting path. Alternatively, the conducting path may be a partial volume of the switching medium. The conducting path may be a region close to an electrode.

The term "filamentary conducting path," as used herein, generally refers to a conducting path in the switching medium that is thin and random (e.g., a portion of the switching medium acts as a conducting path). The filamentary conducting path may be formed by impurities within the switching medium that form the conducting path. A filamentary conducting path may occupy a small volume of the switching medium. For example, a filamentary conducting path may occupy less than or equal to about 40%, 35%, 30%, 25%, 20%, 15%, 10%, 5%, or less of the volume of the switching medium.

The term "mesa" or "mesa structure," as used herein, generally refers to a memory cell formed on a substrate with a switching material and at least two electrodes. The substrate may be a planar substrate and the electrodes may be disposed on the substrate or embedded in the substrate. The substrate may be formed of a semiconductor or an insulating material. The switching medium may be disposed on the substrate or embedded in the substrate and between the electrodes.

The term "crossbar" or "crossbar structure," also sometimes referred to as the "sandwich" or "sandwich structure" as used herein, generally refers to a memory device comprising an array of stacked electrodes. A first layer of electrodes may include an array of rectangular electrodes aligned in a first direction. A second layer of electrodes may include an array of rectangular electrodes aligned in a second direction. The layers of electrodes may be separated by a switching medium. Each layer of electrodes may be separated and electrically coupled to a plurality of switching media. Each memory cell may comprise a single switching medium sandwiched between layers of electrodes.

The term "floating gate" or "floating gate structure," as used here, generally refers to a memory cell comprising a source electrode and a drain electrode disposed on and separate from each other on a substrate. The substrate may be a semiconductor or insulating material. The source and the drain electrodes may be separated by a channel of switching medium disposed on the substrate. A gate structure may be disposed over the channel. The gate structure may be electrically separated from the source and drain electrodes. The gate structure may be a third electrode. The gate structure may be electrically connected to a reservoir of charge carriers. Application of an electrical bias to the gate structure may alter the resistance of the switching medium.

Memory Cells, Devices, and Systems

In an aspect, the present disclosure provides memory cells comprising a first electrode, a second electrode, and a switching medium. The switching medium may be electrically coupled to the first and the second electrode. The switching medium may be configured to provide or may provide a homogeneous conducing path between the first electrode and the second electrode. The resistance of the homogeneous conducting path may be configured to provide or may provide a value of the memory cell. A memory device may comprise a plurality of memory cells. The memory device may be coupled, individually or collectively, to one or more computer processors. The one or more computer processors may be configured to determine a resistance of the homogeneous conducing path to determine a value of the memory cell.

In another aspect, the present disclosure provides memory cells comprising a first electrode, a second electrode, and a switching medium. The switching medium may be electrically coupled to the first electrode and the second electrode. The switching medium may be configured to provide a plurality of resistance states. A resistance state of the plurality of resistance states may change upon application of (i) different voltage biases for a period of time, (ii) a constant voltage for different periods of time, or (iii) a voltage of a different polarity as compared to a previously applied voltage. The resistance state of the switching medium may be configured to provide a value of the memory cell. A memory device may comprise a plurality of memory cells. The memory device may be coupled, individually or collectively, to one or more computer processors. The one or more computer processors may be configured to apply to the switching medium (i) a different voltage biases for a period of time, (ii) a constant voltage for different periods of time, (iii) a voltage of a different polarity as compared to a previously applied voltage to change a resistance state of the plurality of resistance states to write a value to the memory cell.

A memory device may be a semiconductor device that may store information. Information may be represented as multiple states that can be written to the memory device and subsequently read to determine the state. A memory device may comprise a plurality of memory cells. A memory device may include a large array of individual memory cells. A memory device may include greater than or equal to one trillion cells. In some cases, a memory device may have less than one trillion cells. The semiconductor device may comprise a substrate. The substrate may be a single element substrate, such as a silicon substrate, or a multi-element substrate, such as gallium arsenide, gallium nitride, or silicon carbide substrates. The silicon substrate may be a native silicon or may be a doped silicon. The silicon may be doped with boron, arsenic, phosphorus, gallium, or combinations thereof. A memory cell may have two electrodes. Alternatively, or in addition to, a memory cell may have more than two electrodes. A memory cell may also have multiple channels in each electrode. For example, a memory cell may have greater than or equal to 2, 3, 4, 5, 6, 8, 10, 12, 14, 16, 18, 20, or more electrodes. The electrodes may be disposed on a substrate or may be embedded in the substrate. The electrodes may comprise the same material or the electrodes may comprise different materials. For example, the first electrode may comprise a first material (e.g., platinum) and the second electrode may comprise a second material (e.g., Palladium). The electrodes may comprise or be formed of a single element such as but not limited to gold, palladium and platinum. Alternatively, or in addition to, the electrodes may be formed of a combination of elements, such as an alloy or compound. Electrodes can be configured in various forms in each of the structures described elsewhere (mesa, crossbar and floating gate). The different configurations may facilitate the uniform doping.

A memory cell may include a switching medium electrically coupled to the electrodes. The switching medium may be disposed between the electrodes. The switching medium may be a volatile switching medium (e.g., constant power may maintain a value of the memory cell) or non-volatile switching medium (e.g., the switching medium may not use power to maintain a value of the memory cell). In an example, the switching medium is non-volatile. The switching medium may be configured to maintain or may maintain a select resistance without application of power. The select resistance may correspond to a value of the memory cell. The switching medium may be configured to or may maintain a value of the memory cell (e.g., resistance) for greater than or equal to about 1, 2, 4, 6, 8, 10, 15, 20, 30, 40, 50, 100, or more. The switching medium may be a compound. The switching medium may be a compound on a substrate. The compound may be configured as a film (e.g., thin film) or layer on a substrate. The film or layer may be an amorphous film or layer. Alternatively, or in addition to, the film or layer may be a crystalline film or layer. The compound may be a metal oxide. The metal oxide may have the formula $ABO_n$. A and B may be metals. A and B may be different metals. For example, A may include rare earth elements such as europium, neodymium, samarium, lanthanum, gadolinium, or other elements such as calcium, magnesium, iron, sodium, potassium, strontium, lithium, lead or barium, or combinations thereof. In an example, A is neodymium, samarium, or europium. For example, B may include tungsten, iron, nickel, manganese, silicon, tantalum, titanium, niobium, chromium, cobalt, cerium, or combinations thereof. In an example, B is nickel, niobium, tantalum, or titanium. In another example, B is nickel and A is neodymium, samarium, or europium. For example, 0 may be oxygen and n may be the number of oxygen atoms. For example, the metal oxide film may have 1, 2, 3, 4, or more oxygen atoms. In an example, the metal oxide film has 3 oxygen atoms and the chemical formula is $ABO_3$. The substrate may include, but is not limited to, glass, silica, or aluminates. The substrate may be an electrode coated substrate, such as fluorine-doped tin oxide (FTO) on glass or indium tin oxide (ITO) on glass.

The switching medium may be a pure medium or may be injected with a dopant. A switching medium that has been injected with a dopant may have a higher resistance than a switching medium without a dopant. The switching medium may be doped with hydrogen ions, lithium ions, or any combination thereof. The introduction of dopants into the switching medium changes the switching medium's resistance. Applying an electrical bias may change the resistance of the switching medium and a corresponding value of the memory cell.

The switching medium may be a switching medium. FIG. 1A and FIG. 1B show an example memory cell with a first electrode 101, second electrode 103, and switching medium 102. FIG. 1A shows an example memory cell with a homogeneous switching medium with a first resistance state. FIG. 1B shows an example memory cell with a homogeneous switching medium with a second resistance state. At least a portion of the switching medium may provide a homogeneous conducting path. The homogeneous conducting path may occupy a portion of or substantially all of the volume of the switching medium. For example, the homogeneous conducting path may occupy greater than or equal to about 75%, 80%, 85%, 90%, 95%, 97%, 98%, 99%, or more of the switching medium. In an example, the homogenous conducting path occupies about 100% of the switching medium. The switching medium may not comprise a filamentary conducting path. The homogeneous switching medium (e.g., homogeneous conducting path) may allow for a change in resistance state (e.g., from low resistance to high resistance or from high resistance to low resistance) using smaller voltage bias as compared to a filamentary conducting path. Additionally, the behavior of a homogeneous conducting path may not be random and, therefore, may be more effectively modeled and scaled to smaller geometries than a filamentary conducting path. Alternatively, the switching medium may comprise a filamentary conducting path.

FIG. 2 shows an example of a memory cell with a filamentary conducting path. The memory cell may include a first electrode 201, second electrode 203, and filamentary conducting path 202. The switching medium may comprise impurities that generate the filamentary conducting path. The filamentary conducting path may occupy a small volume of the switching medium. For example, the filamentary conducting path may occupy less than or equal to about 50%, 40%, 30%, 20%, 15%, 10%, 5%, or less of the volume of the switching medium. The conducting region may be a partial volume of the switching medium. The conducting region may be close to an electrode.

The substrate may further comprise an ion or charge carrier source. The memory device may comprise a plurality of memory cells. The memory device may comprise memory cells with mesa, crossbar, or floating gate structures. The memory device may include a single memory cell structure (e.g., mesa structure) or multiple memory cell structures (e.g., mesa and floating gate structures).

FIG. 3A and FIG. 3B show examples of a memory cell with a mesa structure. The mesa structure may include two electrodes, 301 and 303, grown on a substrate 304 (e.g., semiconductor substrate). The first electrode 301 and second electrode 303 may be separated by the switching medium 302 such as shown in FIG. 3A or be separated and disposed above the switching medium, such as shown in FIG. 3B. The electrodes may be electrically coupled to and separated by the switching material. Contact pads 305 may allow for electric connection to external power supplies.

Figure 4B:
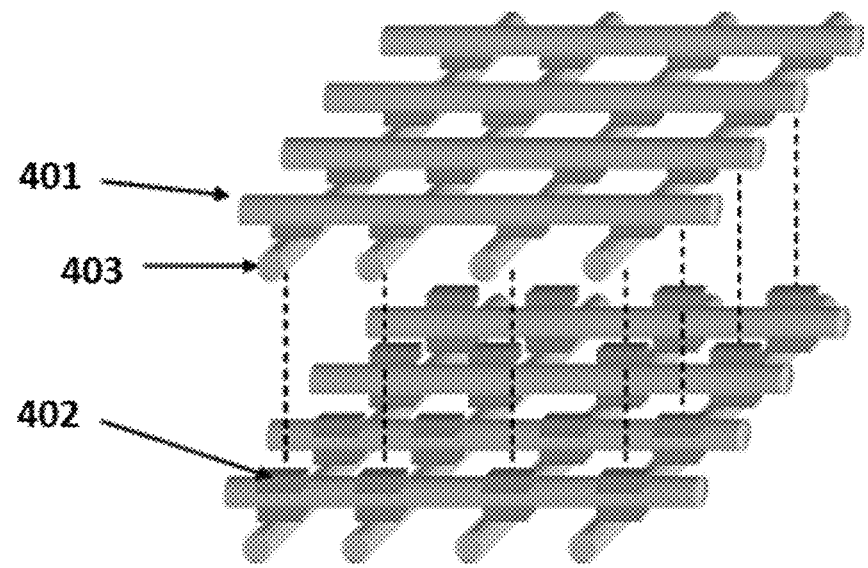

A crossbar structure may include layers of rectangular arrays of electrodes. FIG. 4A and FIG. 4B show examples of a memory cell with a crossbar structure. The first layer of electrode arrays 401 (e.g., bit-line) may be aligned in a first direction on a substrate. A second layer of electrode arrays 403 (e.g., word-line) may be separated from the first layer by the switching medium 402 (e.g., memory element). The switching medium 402 (e.g., memory element) may be discrete volumes of material disposed between overlapping sections of the electrode layers. Each discrete volume of switching medium 402 may define a memory cell. The second layer of electrode arrays may be aligned in a second direction. The second direction may be the same as or different from the alignment of the first direction. The first direction and second direction may be orthogonal or substantially orthogonal to one another (e.g., the long dimension of the first layer and the second layers may be orthogonal). An angle between the long dimension of the first layer of electrodes and the second layer of electrodes may be about 90°. In some cases, the angle may be between about 85° and 95°, between about 86° and 94°, between about 87° and 93°, between about 88° and 92°, or between about 89° and 91°. The crossbar structure may have greater than or equal to 2, 4, 6, 8, 10, 12, 14, 16, 18, 20, 30, 40, 60, 80, 100, 128 or more layers. FIG. 4B shows an example of a three-dimensional (3D) structure of a NOT AND (NAND) flash memory structure.

Figure 5:
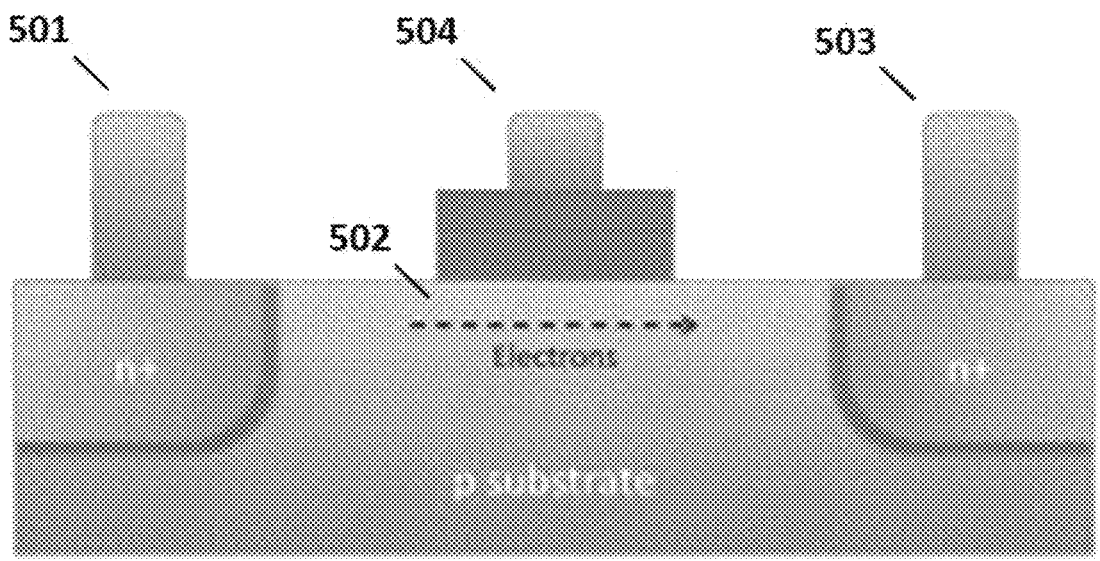
FIG. 5 schematically illustrates an example of a floating gate type memory cell.

The angle between one layer and the layer above may be the same or may vary across the layers. FIG. 5 shows an example of a memory cell with a floating gate structure. The floating gate structure may include a source electrode 501 and a drain electrode 503 separated by a channel of the switching medium 502. The floating gate structure may further comprise a third gate electrode 504 disposed between and electrically separated from the source and the drain electrode. The floating gate structure may provide a reservoir for ions as well as trapping particles to enhance non-volatility.

The memory cell may comprise one or more contacts. The contacts may provide electrical coupling (e.g., provide an electrical connection) between the memory cell and a central processing unit. A memory device may comprise a plurality of contacts. The plurality of contacts may provide electrical coupling (e.g., provide an electrical connection) between the memory device and the central processing unit. A contact may be an ohmic contact or a Schottky contact. The contacts may be electrically coupled to the electrodes. For example, the memory device may comprise a crossbar structure and a first contact may be electrically coupled to (e.g., electrically connected to) the first electrode and a second contact may be coupled to (e.g., electrically connected to) the second electrode of the crossbar structure. The first contact may be an ohmic contact and the second contact may be a Schottky contact. The Schottky contact may act as a diode, preventing or reducing reverse current flow. For example, a memory device with a first ohmic contact coupled to the first electrode and a Schottky contact coupled to the second electrode may avoid reverse current flow.

Figure 7A:
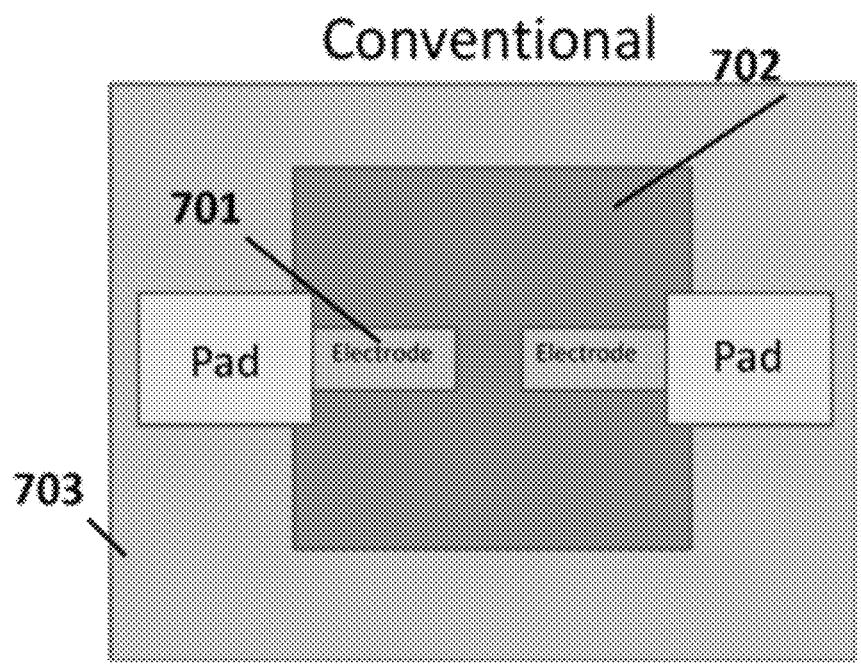
Figure 7B:
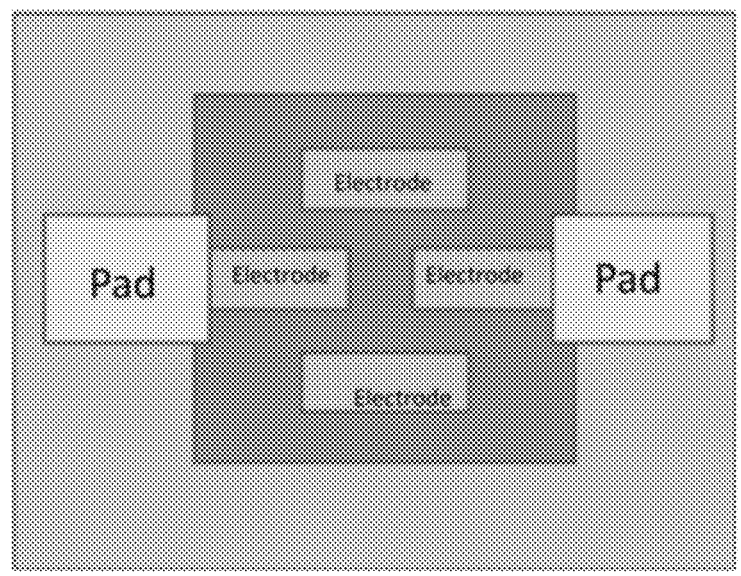
Figure 7C:
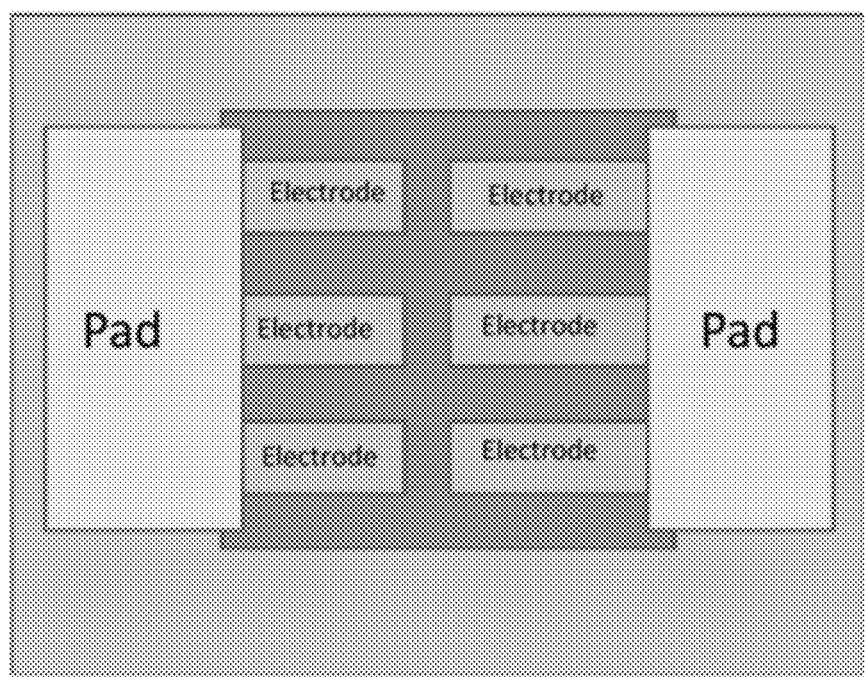

The memory device may be coupled to a selector. The selector may select the memory cell to be accessed. The selector may be a silicon-based selector, metal-oxide based selector, threshold switch selector, mixed ionic-electronic conduction selector, or any combination thereof. Each memory cell of the plurality of memory cells may comprise a selector. Alternatively, or in addition to, a memory device may be constructed without individual cell selectors. For example, the memory device may be a crossbar structure with ohmic and Schottky contacts such that reverse current flow is reduced or prevented. A crossbar structure with ohmic and Schottky contacts may be constructed without individual cell selectors. Each of the above-mentioned structures may be made with various electrode configurations. Three examples of electrode configurations are shown in FIG. 7A, FIG. 7B and FIG. 7C respectively. FIG. 7A shows an example of the top view of a conventional electrode configuration. This configuration, although conventional, may be used in an implementation of the technology disclosed herein. Two electrodes 701 are disposed on or imbedded in a switching medium 702. The structure may be disposed over or embedded in a substrate 703. FIG. 7B shows an example of multiple electrodes. In this example, there are four electrodes, symmetrically disposed on or embedded in the switching medium. The electrode configuration may be symmetrical or non-symmetrical. The example of FIG. 7C shows multiple electrodes forming multiple channels in the switching medium. The contact pad may allow for external electrical connections such as power supply connection to all the electrodes.

Methods of Writing Data to and Accessing Data from Memory Cells

In another aspect, the present disclosure provides methods for accessing data from a memory cell. The method may comprise providing a memory cell comprising a first electrode, a second electrode, and a switching medium electrically coupled to the first electrode and the second electrode. The switching medium may provide a homogeneous conducting path between the first electrode and the second electrode. The switching medium may have a resistance. The magnitude of the resistance may indicate a value (e.g., 0 or 1) of the memory cell. Determining the magnitude of the resistance may thereby determine the value of the memory cell.

In another aspect, the present disclosure provides methods for writing data to a memory cell. The method may comprise providing a memory cell comprising a first electrode, a second electrode, and a switching medium electrically coupled to the first electrode and the second electrode. The switching medium may provide a plurality of resistance states between the first electrode and the second electrode. The resistance state (e.g., resistance) of the switching medium may be changed by application of (i) different voltage biases for a period of time, (ii) a constant voltage for different periods of time, or (iii) a voltage of a different polarity as compared to a previously applied voltage. Changing the resistance state of the switching medium may write a value to the memory cell.

Figure 9:
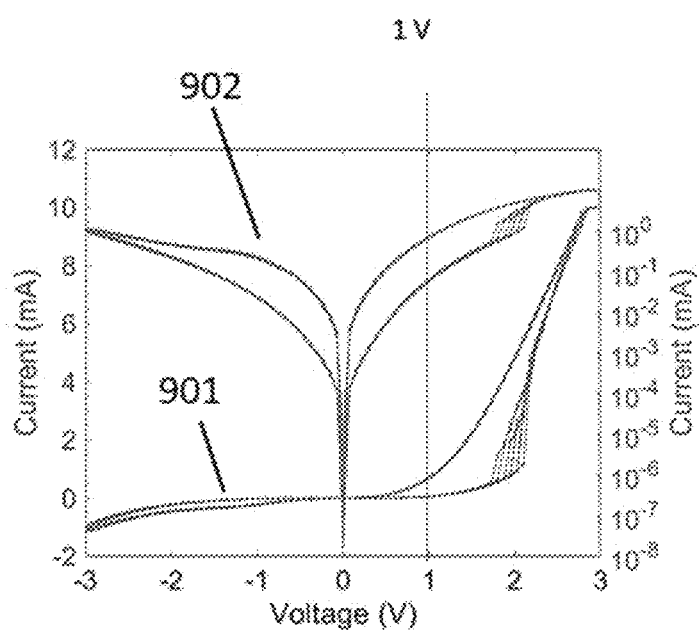
FIG. 9 shows example change of resistance of a switching medium as a function voltage for different resistance states.

A value may be written to a memory cell by changing or altering a resistance of the switching medium. The switching medium may be capable of having or may have an ability to maintain a plurality of resistance states (e.g., multiple resistance states). Each resistance state of the plurality of resistance states may correspond to a value of the memory cell. A value of a memory cell may be set by selecting an applying a given resistance to the memory cell. The resistance of the switching medium of the memory cell may be selected or applied by applying a different voltage bias to the cell for a specific period of time. Switching from one resistance state to another may be accomplished by applying a voltage bias. Switching to different resistance states may be accomplished by applying multiple pulses of a specific voltage bias or by applying different voltage biases for the same pulse duration. FIG. 9 shows example change of resistance as a function of voltage for different resistance states with high resistance state 901 and low resistance state 902.

Figure 10:
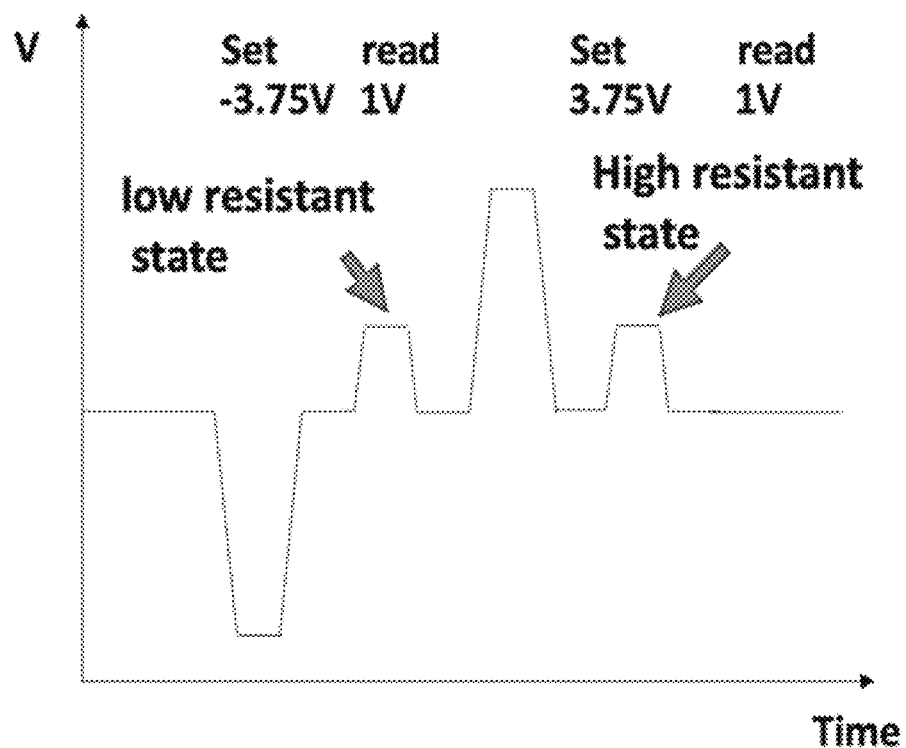
FIG. 10 shows an example of set and reset voltages of a switching medium for high and low resistance states.

Alternatively, or in addition to, the resistance state of the memory cell may be selected or applied by applying a constant voltage bias for different periods of time. Alternatively, or in addition to, the resistance state of the switching medium of the memory cell may be selected or applied by the application of a different voltage polarity. For example, a reversal of polarities may reverse the resistance state. The voltage with the reversed polarity may have the same voltage or different voltage than the previously applied voltage. For example, FIG. 10 shows an example of set and reset voltages for high and low resistance states. The different resistance states may be reached by using different voltages to set or reset states. The set and reset voltages may be the same (e.g., +/−3.75 volts) or different. A smaller read voltage (e.g., 1 volt) may be used to measure the current and determine the resistance at each state.

A value of a memory cell may be accessed or determined by detecting or sensing the resistance of the switching medium (e.g., determining the resistance of a homogeneous switching medium). Sensing the resistance of the switching medium may include using voltage sensing, current sensing, or any combination thereof. In an example, voltage sensing is used to determine the resistance of the switching medium. Voltage sensing may include applying a plurality of pulses of different magnitudes to a memory cell to determine the resistance of the switching medium. Determining resistance of the switching medium may include application of greater than or equal to about 2, 4, 6, 8, 10, 15, 20, 25, 30, 40, 50, or more pulses to the memory cell. The number of pulses may depend on the number of layers in the memory cell. The magnitude of the pulses may be the same or may be different. The magnitude of the pulses may change by greater than or equal to about 5%, 10%, 15%, 20%, 25%, or more during sensing of the resistance of the memory cell. In another example, current sensing is used to determine the resistance of the switching medium. Current sensing may include applying a single voltage pulse to the memory cell to determine the resistance of the switching medium.

Figure 11:
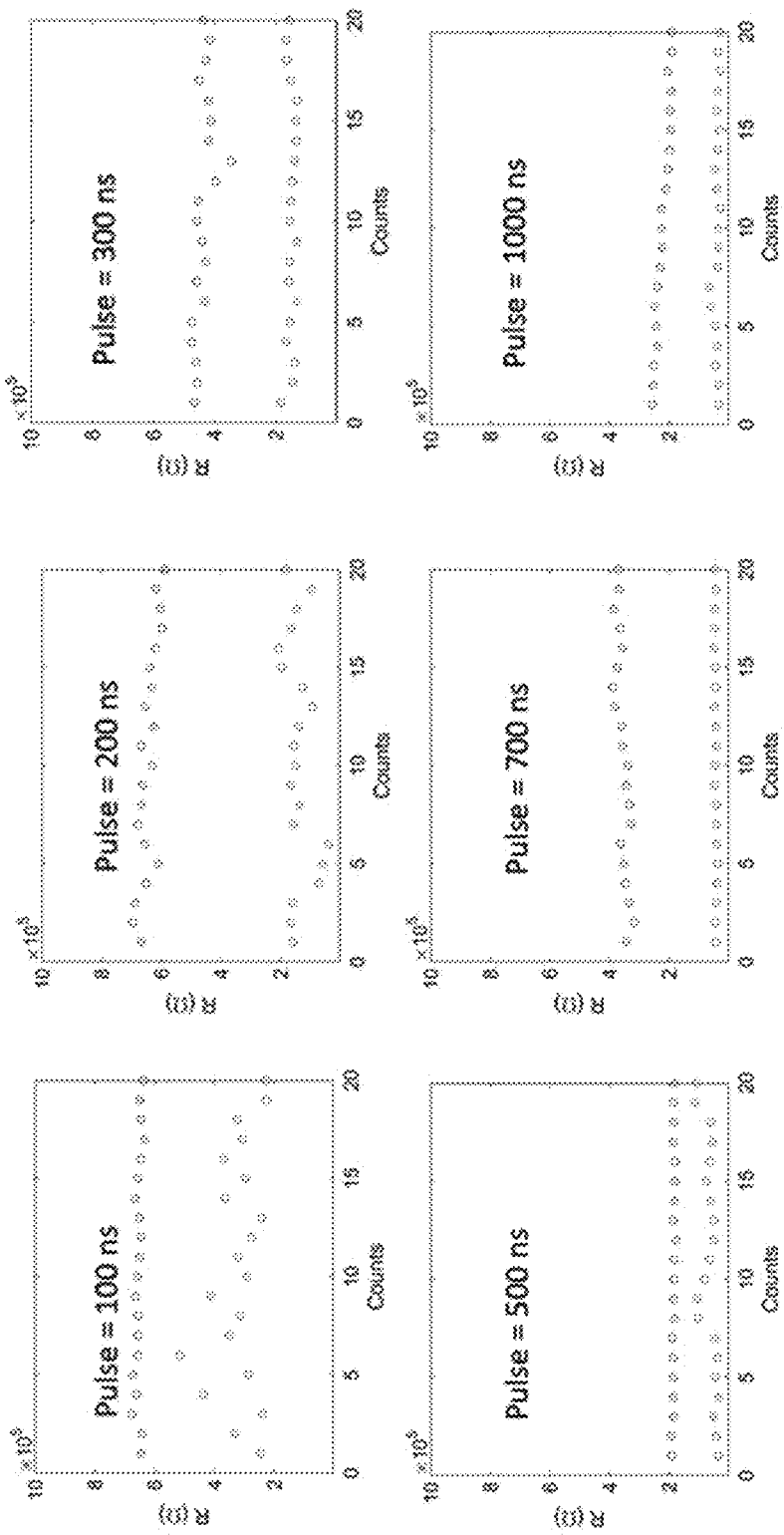
FIG. 11 shows examples of a variety of read and write access speeds for an memory cell.

The memory cells described herein may have an increased reading and writing speed as compared to flash memory. For example, a value may be written to a memory cell in less than or equal to a few hundred nanoseconds or tens of nanoseconds. A value may be read from a memory cell in less than or equal to a few hundred nanoseconds or tens of nanoseconds. In some cases, the read and write times may be at most about 10 nanoseconds (ns), 9 ns, 8 ns, 7 ns, 6 ns, 5 ns, 4 ns, 3 ns, 2 ns, 1 ns, or less. FIG. 11 shows examples of a variety of read and write access speeds. A memory cell may be accessed for reads and writes at different speeds. The different speeds may be achieved by adjusting the pulse widths of the read and write pulses. In, an example the memory cell may be accessed for reads and writes in 1 nanosecond or less.

Figure 12:
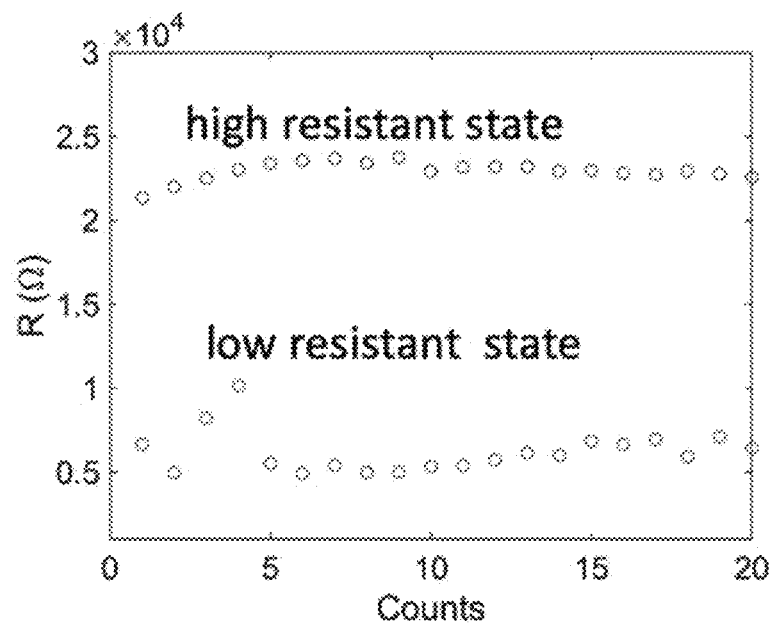
FIG. 12 shows an example of change in resistance of a switching medium as a function of a number of set and re-set cycles.
Figure 13:
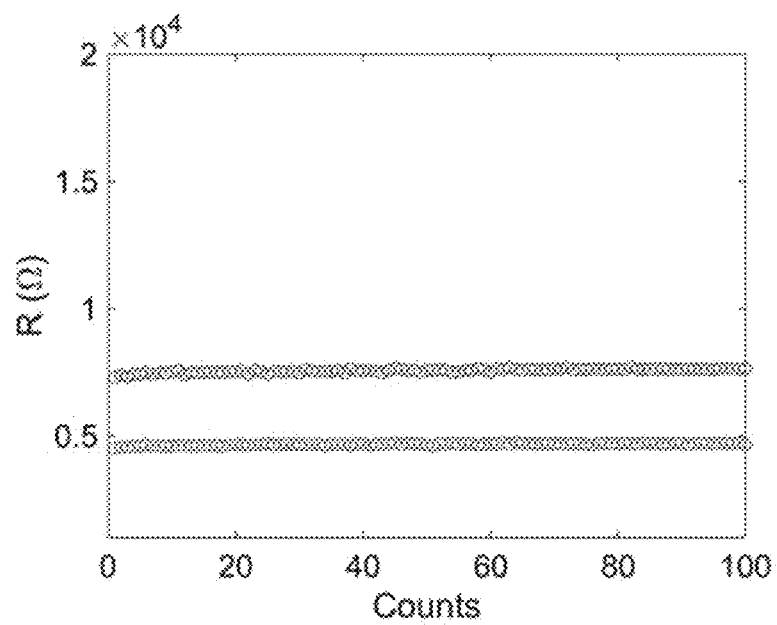
FIG. 13 shows an example of resistance state stability of a switching medium over time.

The memory cells may be subjected repeatedly to different set and reset voltages to change the resistance state of the switching medium. FIG. 12 shows an example of change in resistance as a function of a number of set and reset cycles. A memory cell may be configured to withstand greater than or equal to about 10, 100, $10^3$, $10^4$, $10^5$, $10^6$, $10^7$, $10^8$, $10^9$, $10^{10}$, $10^{11}$, $10^{12}$, $10^{13}$, $10^{14}$, $10^{15}$, $10^{16}$, $10^{18}$, $10^{20}$, or more set and reset cycles. In an example, a memory cell is configured to withstand greater than or equal to $10^{15}$ set and reset cycles. The memory may be a non-volatile memory such that a resistance state of the switching medium is stable over time. Once the device is set to a high or low resistance state, this resistance state may be read multiple times without loss of accuracy. FIG. 13 shows an example of resistance state stability of the switching medium over time when a single resistance state is read multiple times without an intervening set/reset. The resistance state of the switching medium may be stable for greater than or equal to about 1 year, 2 years, 5 years, 10 year, 15 years, 20 years, 30 years, 50 years, 100 year, or more.

Any of the methods described herein for writing, storing, and accessing data from a memory cell may be used with any of the memory cells, memory devices, and systems described elsewhere herein.

Methods of Fabricating Memory Cells

Memory devices may comprise a plurality of memory cells. Memory devices and/or memory cells may be fabricated using semiconductor device fabrication processes. Semiconductor device fabrication processes may include multi-step processes that include photolithographic processes, chemical processes, physical processes, or any combination thereof. Photolithographic processes may include application of one or more photoresists (e.g., positive or negative photoresists) onto a substrate (e.g., a semiconductor substrate), patterning the photoresist, developing the photoresist, removal of substrate material and/or deposition within the patterned domain of the patterned photoresist.

Chemical and physical processes may be used to add material to or remove material from the substrate. Chemical processes may include surface passivation, chemical etching (e.g., wet etching, dry etching, chemical milling, etc.), thermal oxidation, planar diffusion, chemical vapor deposition, chemical-mechanical polishing, or any combination thereof. Physical processes may include dry etching, ion implantation, atomic layer etching, atomic layer deposition, thermal treatments (e.g., annealing), physical vapor deposition, molecular beam epitaxy, electrochemical deposition, laser lift-off, or any combination thereof. The mesa structure may be formed by growing the switching medium on a substrate. The switching medium may be patterned and select regions of the switching medium may be thinned and/or removed and the electrodes may be deposited (e.g., using sputtering or other deposition technique).

The switching medium may be a film (e.g., thin film) or layer on a substrate. The substrate may be glass, silica, aluminates (e.g., Lanthanum Aluminate), or any other insulating substrate. The switching medium may be grown or deposited on the substrate. The substrate may or may not include the electrode or electrodes. In an example, the substrate includes the electrode and the switching medium is grown or deposited on the electrodes to couple the electrodes. In another example, the switching medium is deposited on the substrate and the electrodes are subsequently deposited on the substrate. In an example, the switching medium may be grown on one or more electrodes disposed on a substrate such as a fluorine-doped tin oxide or indium tin oxide substrate. In an example, the substrate may permit epitaxial growth of the switching medium. Epitaxial growth may be an efficient process for growth of the switching medium.

In an example, the switching medium may be grown on the substrate using sputtering. Sputtering may be used to grow thin films of select gap widths. The gap width may be from a few nanometers to hundreds or thousands of nanometers. The gap width may be from about 1 nanometer (nm) to 10 nm, 1 nm to 100 nm, or 1 nm to 1000 nm. The sputtering process may include using the compounds that form the switching medium as the target (e.g., cathode target). In an example, ceramic targets formed of compounds that make up the switching medium may be used. Alternatively or additionally, sputtering may be performed using an alloy of metals A and B as the cathode target to first obtain a film of the alloy on the substrate. The alloy film may be subjected to an oxidation process to form the $ABO_n$ film or layer. Alternatively, or in addition to, the film or layer of switching medium may be formed on the substrate by co-sputtering using multiple metal targets (e.g., cathode targets). The power applied to each target may be adjusted to generate select stoichiometric proportions of A and B in the film or layer of switching medium. The sputtered film may be subjected to an oxidation process to form the $ABO_n$ film or layer. In an example, the oxidation process may form $ABO_3$.

The switching medium may be formed by sputtering in the presence of an inert gas, oxygen, or both an inert gas and oxygen. In an example, the switching medium is formed by sputtering in the presence of an inert gas and oxygen. The inert gas may include argon, neon, krypton, xenon, or any combination thereof. The ratio of inert gas to oxygen may be varied from 4-to-1 to 5-to-1, 4-to-1 to 10-to-1, 4-to-1 to 15-to-1, 4-to-1 to 20-to-1, 4-to-1 to 25-to-1, 4-to-1 to 30-to-1, 4-to-1 to 40-to-1, or 4-to-1 to 50-to-1. In an example, the ration of inert gas to oxygen may be varied from 4-to-1 to 20-to-1. The ratio of inert gas to oxygen may can alter the deposition rate of the switching medium.

The switching medium may be formed by sputtering at a variety of temperatures. The temperature may be constant during sputtering or may vary during the sputtering process. The temperature of the sputtering process may vary from about 20° C. to about 500° C. The temperature of the sputtering process may be greater than or equal to about 20° C., 40° C., 60° C., 80° C., 100° C., 150° C., 200° C., 250° C., 300° C., 350° C., 400° C., 450° C., 500° C., or more. The temperature of the sputtering process may be less than or equal to about 500° C., 450° C., 400° C., 350° C., 300° C., 250° C., 200° C., 150° C., 100° C., 80° C., 60° C., 40° C., 20° C., or less. The temperature of the sputtering process may be from about 20° C. to 40° C., 20° C. to 60° C., 20° C. to 80° C., 20° C. to 100° C., 20° C. to 150° C., 20° C. to 200° C., 20° C. to 250° C., 20° C. to 300° C., 20° C. to 350° C., 20° C. to 400° C., 20° C. to 450° C., 20° C. to 500° C., 40° C. to 60° C., 40° C. to 80° C., 40° C. to 100° C., 40° C. to 150° C., 40° C. to 200° C., 40° C. to 250° C., 40° C. to 300° C., 40° C. to 350° C., 40° C. to 400° C., 40° C. to 450° C., ° C. to 500° C., 60° C. to 80° C., 60° C. to 100° C., 60° C. to 150° C., 60° C. to 200° C., 60° C. to 250° C., 60° C. to 300° C., 60° C. to 350° C., 60° C. to 400° C., 60° C. to 450° C., 60° C. to 500° C., 80° C. to 100° C., 80° C. to 150° C., 80° C. to 200° C., 80° C. to 250° C., 80° C. to 300° C., 80° C. to 350° C., 80° C. to 400° C., 80° C. to 450° C., 80° C. to 500° C., 100° C. to 150° C., 100° C. to 200° C., 100° C. to 250° C., 100° C. to 300° C., 100° C. to 350° C., 100° C. to 400° C., 100° C. to 450° C., 100° C. to 500° C., 150° C. to 200° C., 150° C. to 250° C., 150° C. to 300° C., 150° C. to 350° C., 150° C. to 400° C., 150° C. to 450° C., 150° C. to 500° C., 200° C. to 250° C., 200° C. to 300° C., 200° C. to 350° C., 200° C. to 400° C., 200° C. to 450° C., 200° C. to 500° C., 250° C. to 300° C., 250° C. to 350° C., 250° C. to 400° C., 250° C. to 450° C., 250° C. to 500° C., 300° C. to 350° C., 300° C. to 400° C., 300° C. to 450° C., 300° C. to 500° C., 350° C. to 400° C., 350° C. to 450° C., 350° C. to 500° C., 400° C. to 450° C., 400° C. to 500° C., or 450° C. to 500° C. The temperature of the sputtering process may alter the deposition rate of the switching medium. In an example, the temperature of the sputtering process may be from about 20° C. to 500° C.

The switching medium may comprise an amorphous or non-crystalline state after sputtering. Alternatively or additionally, the switching medium may be at least partially in a crystalline state. The switching medium may be subjected to an annealing process. The annealing process may increase oxidation of the switching medium as compared to a non-annealed switching medium. In an example, the annealing process fully oxidize the film or layer. The annealing process may alter or otherwise change the crystallinity of the switching medium as compared to a switching medium that has not been annealed. In an example, annealing the switching medium generates a film or layer with a perovskite crystalline state. The switching medium may be annealed at a single temperature or the temperature of annealing may be varied during the annealing process. The switching medium may be annealed at a temperature of greater than or equal to about 200° C., 300° C., 400° C., 500° C., 600° C., 700° C., or more. The switching medium may be annealed at a temperature of less than or equal to about 700° C., 600° C., 500° C., 400° C., 300° C., 200° C., or less. The switching medium may be annealed for a time of less than or equal to about 24 hours, 22 hours, hours, 18 hours, 16 hours, 14 hours, 12 hours, 10 hours, 8 hours, 6 hours, 4 hours, 2 hours, 1 hour, or less. The switching medium may be annealed for a time of greater than or equal to about 1 hour, 2 hours, 4 hours, 6 hours, 8 hours, 10 hours, 12 hours, 14 hours, 16 hours, 18 hours, 20 hours, 22 hours, 24 hours, or more.

Figure 8:
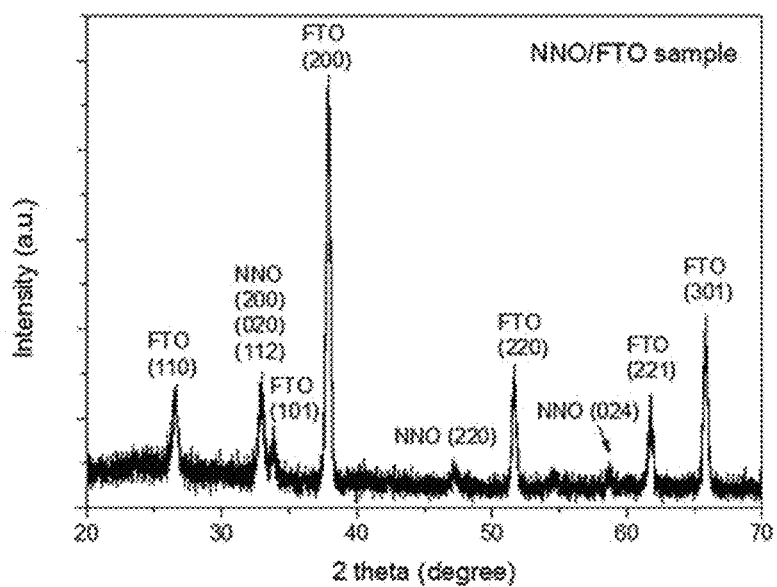
FIG. 8 shows an example x-ray diffraction analysis of a perovskite crystal phase for neodymium nickelate (NNO) film on fluorine-doped tin oxide (FTO) substrate.

The crystalline state of the switching medium may be verified experimentally. In an example, the crystalline state of the switching medium is verified by x-ray diffraction (XRD). The composition of the film may be verified using X-ray photoelectron spectroscopy (XPS) and the thickness of the film may be verified using profilometry. FIG. 8 shows an example XRD analysis of a perovskite crystal phase for a neodymium nickelate (NNO) film on fluorine-doped tin oxide (FTO) substrate.

Memory cells may be fabricated using a number of different techniques including photolithography and electron beam (E-beam) lithography. For example, E-beam lithography may be used to fabricate a device of a specific geometry and structure. A substrate comprising electrodes and a switching medium (e.g., thin film or layer) may be cleaned and a layer of photoresist may be deposited on the surface. The photoresist may be deposited on the switching medium by spin coating or other photoresist deposition technique. The photoresist may be a negative tone or positive tone photoresist. In an example, the photoresist is a negative tone photoresist. The photoresist may be patterned and exposed by E-beam lithography. The photoresist may be developed and the switching medium may be etched to remove select sections or segments of the switching medium (e.g., film or layer). The switching medium may be etched using a wet etch (e.g., acid etch, caustic etch, etc.) or plasma etching (e.g., reactive-ion etching, deep reactive-ion etching, ion milling, etc.). In an example, the switching medium is removed using a reactive-ion etching (ME). Photoresist remaining on the switching medium may be removed subsequent to etching of the switching medium. A second layer of photoresist may be applied to the switching medium. The second photoresist may be a positive or negative photoresist. In an example, the second photoresist is a positive photoresist (e.g., polymethyl methacrylate photoresist). In another example, the substrate that supports the switching medium may be an insulating substrate (e.g., glass, silica, etc.) and an anti-charge coat is applied adjacent to the second photoresist layer. The second photoresist layer may be patterned and exposed via photolithography or E-beam lithography and developed to remove select portions of the second photoresist layer. The electrode may be added using metal deposition techniques, such as chemical vapor deposition, plating, sputtering, evaporation, or any combination thereof. In an example, the electrodes are deposited using chemical vapor deposition. The process of applying the second photoresist layer, development, and metal deposition may be repeated for electrodes using various materials. Alternatively, the depositions process may use an alloy of materials.

The memory cells may be annealed subsequent to fabrication of the switching medium and electrodes on the substrate. The anneal may be a forming gas (e.g., gas with 5% hydrogen and 95% nitrogen) anneal. The temperature of the anneal (e.g., forming gas anneal) may be greater than or equal to about 100° C., 200° C., 300° C., 400° C., 500° C., or more. The switching medium may be annealed at a temperature of less than or equal to about 500° C., 400° C., 300° C., 200° C., 100° C., or less. The memory cells may be subjected to the annealing temperature and gas for greater than or equal to about 5 minutes, 10 minutes, 15 minutes, 20 minutes, 30 minutes, 40 minutes, 50 minutes, 1 hour, 2 hours, 3 hours, 4 hours, 5 hours, or more. The memory cells may be subjected to the annealing temperature and gas for less than or equal to about 5 hours, 4 hours, 3 hours, 2 hours, 1 hours, 50 minutes, 40 minutes, 30 minutes, 20 minutes, 10 minutes, 5 minutes, or less. In an example, the memory cells is annealed with a forming gas at a temperature of greater than or equal to 200° C. for greater than or equal to about 15 minutes. The memory cell may or may not be passivated by deposition of a silicon oxide passivation layer.

The fabrication techniques described herein may be used for the fabrication of memory cells of various structures. For example, fabrication of the mesa or vertical structure may include deposition of the switching material on a substrate. The switching medium may be patterned, thinned, and removed for the deposition of electrodes. Ion milling of RIE may be used to thin or remove the switching medium. In another example, fabrication of the crossbar structure may comprise providing the first electrode. The switching medium may be grown or deposited on the first electrode. The second electrode may be deposited or grown on the second electrode. In another example, fabrication of the floating gate structure may include formation of a first electrode, second electrode, and third electrode on a substrate. The third electrode may be the gate electrode. The gate electrode may be connected to a reservoir of charge carriers.

Memory cells may be generated with electrodes placed on a common substrate. Pairs of electrodes may act as a single cell. Alternatively, or in addition to, individual islands of the switching medium may be generated and electrodes may be placed on each side of the island of switching medium to generate electric isolation between the individual memory cells of a memory device.

Computer Systems

Figure 6:
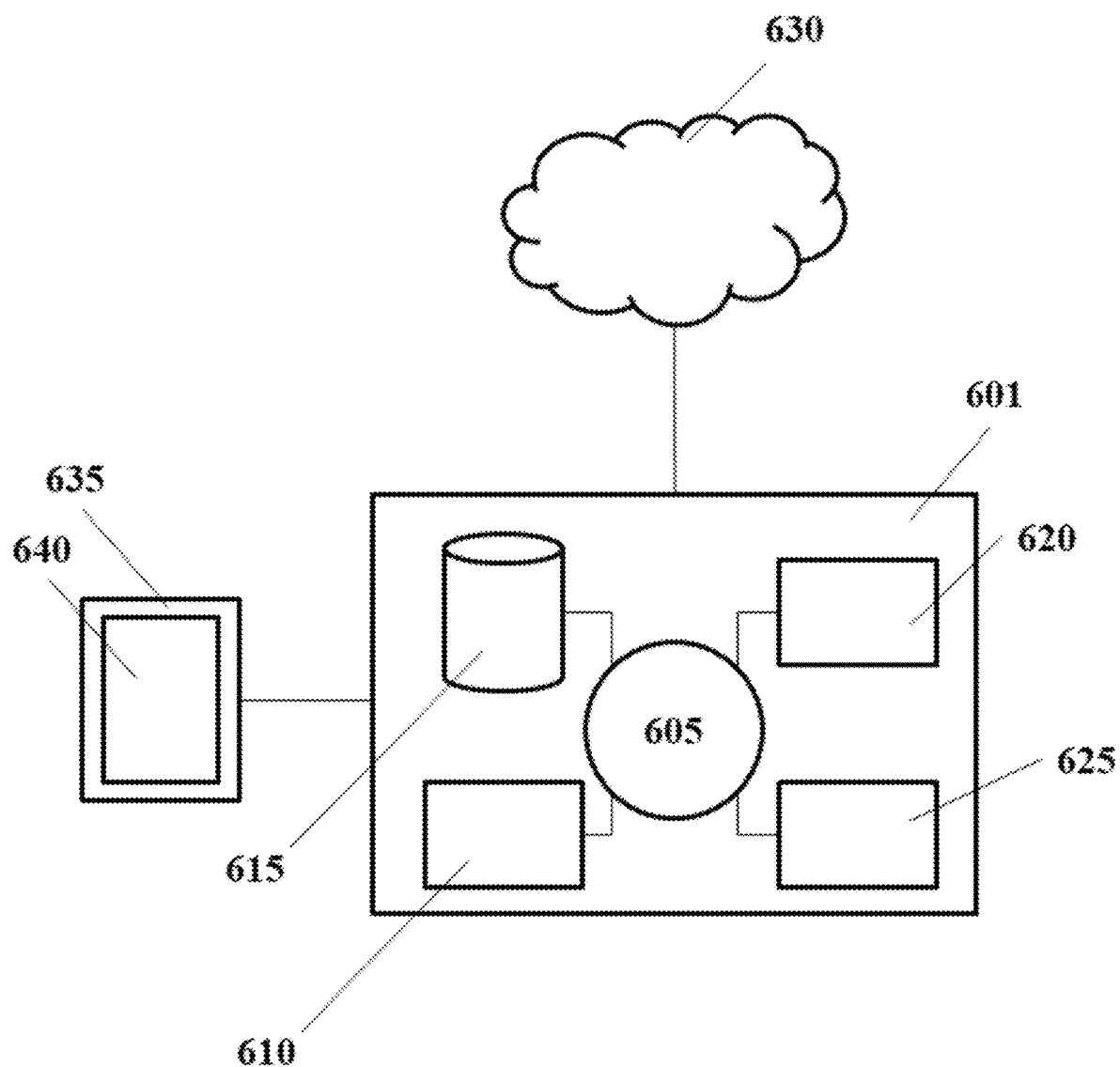
FIG. 6 illustrates a computer system that is programmed or otherwise configured to implement methods provided herein.

The present disclosure provides computer systems that are programmed to implement methods of the disclosure. FIG. 6 shows a computer system 601 that is programmed or otherwise configured to write data to a memory cell or memory device or read and/or access data from a memory cell or memory device. The computer system 601 can regulate various aspects of the methods of the present disclosure, such as, for example, fabrication of memory cells or writing to or accessing data from one or more data cells. The computer system 601 can be an electronic device of a user or a computer system that is remotely located with respect to the electronic device. The electronic device can be a mobile electronic device. The computer system may be used to control methods for fabrication of memory cells or memory devices with a plurality of memory cells. The computer system may be used to write data to or access data from the memory cells or memory device.

The computer system 601 includes a central processing unit (CPU, also "processor" and "computer processor" herein) 605, which can be a single core or multi core processor, or a plurality of processors for parallel processing. The computer system 601 also includes memory or memory location 610 (e.g., random-access memory, read-only memory, flash memory), electronic storage unit 615 (e.g., hard disk), communication interface 620 (e.g., network adapter) for communicating with one or more other systems, and peripheral devices 625, such as cache, other memory, data storage and/or electronic display adapters. The memory 610, storage unit 615, interface 620 and peripheral devices 625 are in communication with the CPU 605 through a communication bus (solid lines), such as a motherboard. The storage unit 615 can be a data storage unit (or data repository) for storing data. The computer system 601 can be operatively coupled to a computer network ("network") 630 with the aid of the communication interface 620. The network 630 can be the Internet, an internet and/or extranet, or an intranet and/or extranet that is in communication with the Internet. The network 630 in some cases is a telecommunication and/or data network. The network 630 can include one or more computer servers, which can enable distributed computing, such as cloud computing. The network 630, in some cases with the aid of the computer system 601, can implement a peer-to-peer network, which may enable devices coupled to the computer system 601 to behave as a client or a server.

The CPU 605 can execute a sequence of machine-readable instructions, which can be embodied in a program or software. The instructions may be stored in a memory location, such as the memory 610. The instructions can be directed to the CPU 605, which can subsequently program or otherwise configure the CPU 605 to implement methods of the present disclosure. Examples of operations performed by the CPU 605 can include fetch, decode, execute, and writeback.

The CPU 605 can be part of a circuit, such as an integrated circuit. One or more other components of the system 601 can be included in the circuit. In some cases, the circuit is an application specific integrated circuit (ASIC).

The storage unit 615 can store files, such as drivers, libraries and saved programs. The storage unit 615 can store user data, e.g., user preferences and user programs. The computer system 601 in some cases can include one or more additional data storage units that are external to the computer system 601, such as located on a remote server that is in communication with the computer system 601 through an intranet or the Internet.

The computer system 601 can communicate with one or more remote computer systems through the network 630. For instance, the computer system 601 can communicate with a remote computer system of a user (e.g., operator of fabrication equipment and/or computer user). Examples of remote computer systems include personal computers (e.g., portable PC), slate or tablet PC's (e.g., Apple® iPad, Samsung® Galaxy Tab), telephones, Smart phones (e.g., Apple® iPhone, Android-enabled device, Blackberry®), or personal digital assistants. The user can access the computer system 601 via the network 630.

Methods as described herein can be implemented by way of machine (e.g., computer processor) executable code stored on an electronic storage location of the computer system 601, such as, for example, on the memory 610 or electronic storage unit 615. The machine executable or machine-readable code can be provided in the form of software. During use, the code can be executed by the processor 605. In some cases, the code can be retrieved from the storage unit 615 and stored on the memory 610 for ready access by the processor 605. In some situations, the electronic storage unit 615 can be precluded, and machine-executable instructions are stored on memory 610.

The code can be pre-compiled and configured for use with a machine having a processer adapted to execute the code or can be compiled during runtime. The code can be supplied in a programming language that can be selected to enable the code to execute in a pre-compiled or as-compiled fashion.

Aspects of the systems and methods provided herein, such as the computer system 601, can be embodied in programming. Various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such as memory (e.g., read-only memory, random-access memory, flash memory) or a hard disk. "Storage" type media can include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a machine readable medium, such as computer-executable code, may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the databases, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

The computer system 601 can include or be in communication with an electronic display 635 that comprises a user interface (UI) 640 for providing, for example, status of processing equipment or resistive state of a memory cell. Examples of UI's include, without limitation, a graphical user interface (GUI) and web-based user interface.

Methods and systems of the present disclosure can be implemented by way of one or more algorithms. An algorithm can be implemented by way of software upon execution by the central processing unit 605. The algorithm can, for example, write data to or access data from a memory cell or select a memory cell from a plurality of memory cells.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. A memory cell, comprising:
   a first electrode;
   a second electrode; and
   a switching medium electrically coupled to said first electrode and said second electrode, wherein said switching medium is configured such that at least a portion of said switching medium provides a homogenous conducting path between said first electrode and said second electrode, and wherein a resistance of said homogenous conducting path is configured to provide a value of said memory cell.

2. The memory cell of claim 1, wherein said switching medium comprises a chemical formula of $ABO_n$.

3. The memory cell of claim 2, wherein A is selected from the group consisting of europium, neodymium, samarium, lanthanum, gadolinium, calcium, magnesium, iron, sodium, potassium, strontium, lithium, lead or barium, and combinations thereof, and wherein B is selected from the group consisting of tungsten, iron, nickel, manganese, silicon, tantalum, titanium, niobium, chromium, cobalt, cerium, and combinations thereof.

4. The memory cell of claim 1, wherein said first electrode and said second electrode comprise one of a same single material, a same alloy of metals, and a same compound.

5. The memory cell of claim 1, wherein said first electrode is electrically coupled to an ohmic contact and said second electrode is coupled to a Schottky contact.

6. The memory cell of claim 1, wherein said switching medium is doped with hydrogen ions and/or lithium ions.

7. A memory cell, comprising:
   a first electrode;
   a second electrode; and
   a non-filamentary switching medium electrically coupled to said first electrode and said second electrode, wherein said non-filamentary switching medium is configured to provide a plurality of resistance states, wherein a resistance state of said plurality of resistance states changes upon application of (i) different voltage biases for a period of time, (ii) a constant voltage for different periods of time, or (iii) a voltage of a different polarity as compared to a previously applied voltage, and wherein said resistance state of said non-filamentary switching medium is configured to provide a value of said memory cell.

8. The memory cell of claim 7, wherein said non-filamentary switching medium comprises a chemical formula of $ABO_n$.

9. The memory cell of claim 8, wherein A is selected from the group consisting of europium, neodymium, samarium, lanthanum, gadolinium, calcium, magnesium, iron, sodium, potassium, strontium, lithium, lead or barium, and combinations thereof, and wherein B is selected from the group consisting of tungsten, iron, nickel, manganese, silicon, tantalum, titanium, niobium, chromium, cobalt, cerium, and combinations thereof.

10. The memory cell of claim 7, wherein said first electrode and said second electrode comprise one of a same single material, a same alloy of metals, and a same compound.

11. The memory cell of claim 7, wherein said first electrode is electrically coupled to an ohmic contact and said second electrode is coupled to a Schottky contact.

12. The memory cell of claim 7, wherein said non-filamentary switching medium is doped with hydrogen ions and/or lithium ions.

13. A method of writing data to a memory cell, comprising:
(a) providing said memory cell comprising a first electrode, a second electrode, and a switching medium electrically coupled to said first electrode and said second electrode, wherein said switching medium provides a plurality of resistance states and wherein said switching medium is configured such that at least a portion of said switching medium provides a homogenous conducting path between said first electrode and said second electrode; and
(b) applying to said switching medium (i) different voltage biases for a period of time, (ii) a constant voltage for different periods of time, (iii) different voltage biases for different periods of time, or (iv) a voltage of a different polarity as compared to a previously applied voltage to change a resistance state of said plurality of resistance states to thereby write a value to said memory cell.

14. The method of claim 13, wherein a switching time of said switching medium is altered by applying a plurality of voltage pulses, and wherein a voltage pulse of the plurality of voltage pulses has a different magnitude than another voltage pulse of the plurality of voltage pulses.

15. The method of claim 13, wherein said resistance state is changed by applying different voltage biases for a period of time, a constant voltage for different periods of time, or different voltages for different periods of time.

16. The method of claim 13, wherein said resistance state is changed by applying a voltage of a different polarity as compared to a previously applied voltage.

17. The method of claim 13, wherein said first electrode is electrically coupled to an ohmic contact and said second electrode is electrically coupled to a Schottky contact.

18. The method of claim 13, wherein said switching medium comprises a chemical formula of $ABO_n$.

19. The method of claim 18, wherein A is selected from the group consisting of europium, neodymium, samarium, lanthanum, gadolinium, calcium, magnesium, iron, sodium, potassium, strontium, lithium, lead or barium, and combinations thereof, and wherein B is selected from the group consisting of tungsten, iron, nickel, manganese, silicon, tantalum, titanium, niobium, chromium, cobalt, cerium, and combinations thereof.

* * * * *